(12) United States Patent
Liebeke

(10) Patent No.: US 7,036,702 B2
(45) Date of Patent: May 2, 2006

(54) DEVICE AND METHOD FOR FEEDING TAPED ELECTRICAL COMPONENTS

(75) Inventor: Thomas Liebeke, Ottobrunn (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/473,427

(22) PCT Filed: Mar. 19, 2002

(86) PCT No.: PCT/DE02/00994

§ 371 (c)(1),
(2), (4) Date: Sep. 30, 2003

(87) PCT Pub. No.: WO02/080643

PCT Pub. Date: Oct. 10, 2002

(65) Prior Publication Data

US 2004/0094594 A1  May 20, 2004

(30) Foreign Application Priority Data

Mar. 30, 2001 (DE) .............................. 101 15 908

(51) Int. Cl.
*B65H 20/00* (2006.01)

(52) U.S. Cl. .................. 226/139; 226/128; 226/45; 226/32

(58) Field of Classification Search .................. 226/2, 226/45, 32, 82, 128, 139, 138
See application file for complete search history.

(56) References Cited

U.S. PATENT DOCUMENTS

| 5,024,720 A | * | 6/1991 | Boss et al. ................... 156/584 |
| 5,695,106 A | * | 12/1997 | Bauknecht ..................... 226/2 |
| 6,032,845 A |  | 3/2000 | Piccone et al. |
| 6,619,526 B1 | * | 9/2003 | Souder, Jr. ................... 226/151 |

FOREIGN PATENT DOCUMENTS

| EP | 0345061 | 12/1989 |
| EP | 0589275 | 3/1994 |

* cited by examiner

*Primary Examiner*—Kathy Matecki
*Assistant Examiner*—Evan Langdon
(74) *Attorney, Agent, or Firm*—Harness, Dickey & Pierce, P.L.C.

(57) ABSTRACT

A drive wheel for a tape accommodating the components is provided with an angle measuring device. This allows for a finely tuned rotational adjustment of the drive wheel. The pick-up position of the components can be detected by a scanning optical system and can be corrected such that the pouch center can be set precisely to a constant advance position.

16 Claims, 1 Drawing Sheet

DEVICE AND METHOD FOR FEEDING TAPED ELECTRICAL COMPONENTS

This application is the national phase under 35 U.S.C. § 371 of PCT International Application No. PCT/DE02/00994 which has an International filing date of Mar. 19, 2002, which designated the United States of America and which claims priority on German Patent Application number DE 101 15 098.0 filed Mar. 30, 2001, the entire contents of which are hereby incorporated herein by reference.

FIELD OF THE INVENTION

The invention generally relates to a device for feeding taped electrical components in a feeding mechanism with a drive for the advancement of a tape accommodating the components. Preferably, it relates to one whereby the components are taken up in pouches on the tape and can be transported stepwise to a defined pick-up position, whereby the drive comprises a motor and a drive wheel driven by the motor, whereby the tape is provided with feed holes into which the transport pins of the drive wheel engage, and whereby the drive is provided with a control facility for modifying the advance distance.

BACKGROUND OF THE INVENTION

Feed modules of this type are normally provided with a sprocket wheel whose radially projecting pins engage in feed holes in the tape and which is rotated in defined angular steps in accordance with the separation spacing of the pouches on the tape. The pouches have a defined positional relationship with respect to the feed holes. At the end of the manufacturing process, centering marks having a defined positional relationship with respect to the pins on the sprocket wheel and which are intended to compensate for the production tolerances are applied on the feed modules in the area of the pick-up point. In addition, it is usual after installing the feed module to measure the position of the centering marks on the feed module in a feed zone of an automatic component mounting machine by means of a camera located on a traveling component mounting head in order to be able to compensate for the installation tolerances. In this situation, operational deviations in the drive system of the feed module cannot be fully eliminated.

As modern technologies have developed, an ever greater level of miniaturization has become a feature of the components to be mounted. It is normal to provide the mounting head with a suction gripping device which is placed over the components to be picked up and which attaches these by suction to its front. In this situation, the gripping device must dip into the pouch in order to be able to come into contact with the component. The permissible tolerances between the feed hole and the pouch are so great that the suction gripping device carrying out the pick-up operation cannot reliably be set up accurately for the component to be picked up and comes into contact with the edge of the pouch and thereby fails to collect the component. In this situation, however, at least over a fairly long section of the tape this is a case of a systematic fault.

The feed mechanisms are designed such that they can for example be operated in accordance with EP 0 589 275 A1 with different separation spacings, whereby a drive motor performs a different number of rotations per advance step before the drive shaft is transported against a rotation stop. Depending on the length of the components, the central position of the component pouch can vary in the pick-up position within a pick-up area. This deviation is taken into consideration by means of an appropriate correction in the position of the mounting head.

According to WO98/37744 A1, for example, it is furthermore normal to arrange a positioning arm for guiding the mounting head in such a way that it extends in the direction of the series of feed mechanisms which are arranged side by side. When the different components are picked from the individual feed mechanisms, the positioning arm must then execute corresponding correction steps depending on the position of the components to be picked up.

According to U.S. Pat. No. 6,032,845 A, a feed mechanism is furthermore provided with a tape drive whose advance distance can be adjusted depending on the separation spacing of the components on the tape. This is driven by a transport wheel with radially projecting pins which engage in the feed holes in the tape. An optical sensor is directed onto the teeth and can thus monitor the precise functional setting of one of the teeth.

In addition, a modular feed mechanism has become known as a result of EP 0345061 A, in which the component tape can be advanced by means of a slider with retractable transport pins. The length of stroke of the slider, which is driven by a compressed-air cylinder, and thus the advance distance of the tape can be set manually by means of an adjustable stop to the relevant spacing division for the tape. Such a change of setting is necessary whenever a tape having a different spacing division is mounted.

SUMMARY OF THE INVENTION

An object of an embodiment of the present invention is to facilitate the pick-up of the components in the event of a positional deviation.

As a result of the fine level of variability for the advancement length, it is possible to perform an adjustment precisely to a specific pick-up position regardless of the size of the advancement and of its longitudinal deviation on the tape. This adjustment step can be carried out for example following every tape change by measuring the actual position of the component or of the component pouch by using the camera attached to the component mounting head. This operation can also be performed between two tape change operations if the fault rate increases significantly during the pick-up operation particularly in the case of very small components. A particular advantage resides in the fact that it is possible in this manner to align all the pick-up points for a group of feed mechanisms in a single line such that the positioning arm can stand in a fixed position while the multiple mounting head is traveling to the different pick-up locations, which results in a reduction in the corresponding drive and time resource requirements. The fine level of variability of the advancement length also results in the fact that the central position of components having greatly differing lengths can always be set to the same pick-up position without an additional preparatory resource requirement.

According to one advantageous development of an embodiment of the invention, the drive has a drive wheel capable of being coupled to the tape, which is provided with an angle measuring scale, and the feed mechanism is provided with a corresponding sensing device. As a result of the direct assignment of this encoder to the drive wheel, the position sensing is carried out directly on the drive element. In this situation, motor and gearbox tolerances are totally excluded. The angle scale can for example comprise an optical or magnetic marking which is sensed using a corresponding sensor head.

According to another development of an embodiment of the invention, a large number of the feed mechanisms are arranged side by side on a carrier perpendicular to the advance direction and the pick-up points for the individual feed mechanisms can be aligned in a straight line. By this, it is possible to transport a mounting head over the pick-up points in a stationary longitudinal guide, such as is shown for example in EP 0373373 B1 (FIGS. 5 to 7), without it being necessary in this situation to adjust the position of the nozzle in the conveyor direction to the actual pick-up position.

According to a method for feeding the components, the position of the components in the pick-up position is determined by a measuring device and the pick-up position of the components is corrected by changing the stopping position of the drive. By measuring the presented components or the associated tape pouch, positional deviations in the feed mechanism and also in the tape itself can be detected and can be compensated for by correcting the stopping position.

BRIEF DESCRIPTION OF THE DRAWINGS

The present invention will become more fully understood from the detailed description of preferred embodiments given hereinbelow and the accompanying drawings, which are given by way of illustration only and thus are not limitative of the present invention, and wherein.

DETAILED DESCRIPTION OF THE PREFERRED EMBODIMENTS

Figure 1:
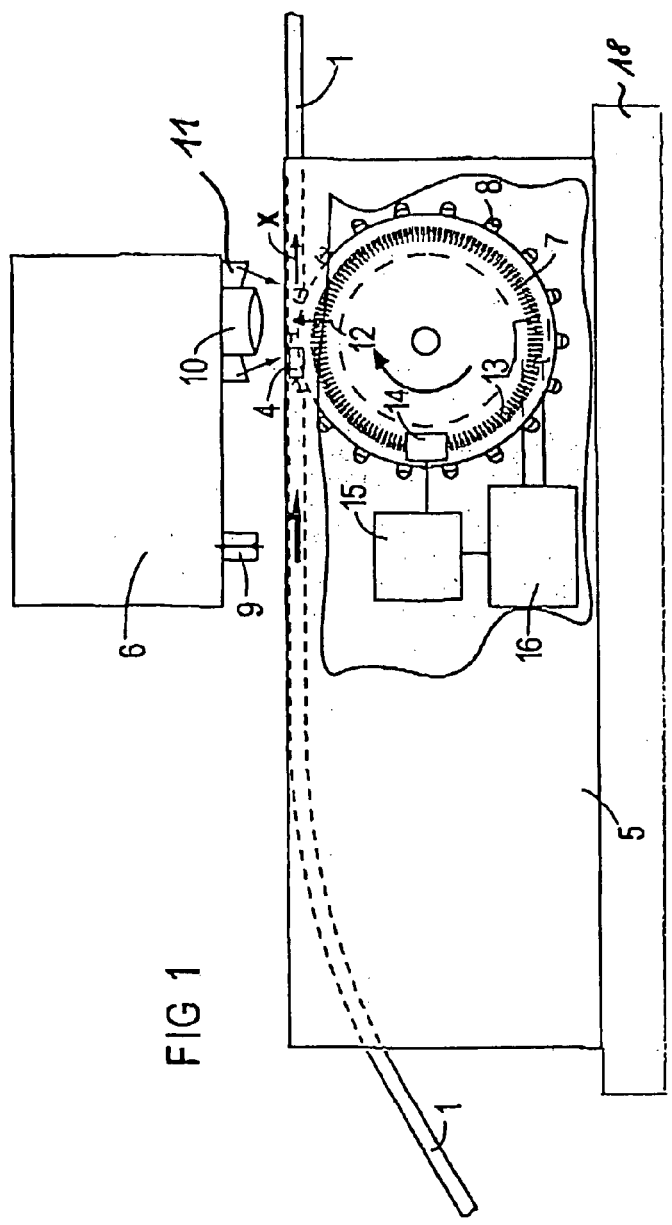
FIG. 1 shows a side view of a component mounting head and a partially revealed feed mechanism having a component tape.
Figure 2:
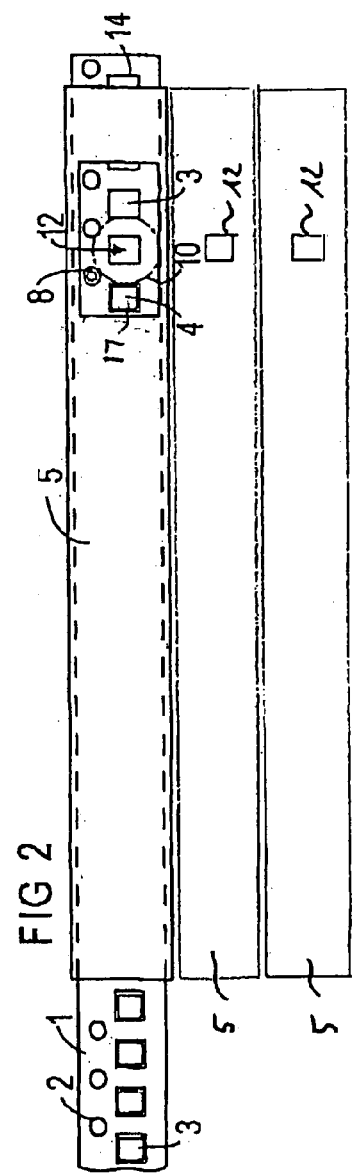
FIG. 2 shows a top view of the feed mechanism according to FIG. 1.

According to FIGS. 1 and 2, a conveyor-like tape 1 having lateral feed holes 2 and pouches 3 for components 4 inserted therein is provided and inserted into a disk-like flat feed mechanism 5 which is fixed in a defined position in the traveling area of a mounting head 6 of a component mounting device. The feed mechanism 5 includes a drive wheel 7, which can be driven stepwise, having peripheral projecting transport pins 8 which engage without free play in the feed holes 2 in the tape 1. The positional relationship between the pouches and the feed holes is defined by relevant standards. The additional tolerances in this case are however almost as great as the lateral dimensions of the smallest components.

On its underside facing the tape, the component mounting head has a suction gripping device 9 and a scanning optical system 10 in the form of a CCT camera whose lens is surrounded by a lighting facility 11 which illuminates the field of view of the scanning optical system 10. The lighting facility 11 can comprise, for example, a large number of light-emitting diodes having different wavelengths and different orientations. In order to accommodate the different tape types, it is possible to control a favorable selection of the diodes in such a way that the structural features of the tape or of the components are shown up in high contrast and can be reliably detected.

The scanning optical system 10 is directed onto a pick-up point 12 for the components in the feed mechanism 5. It is capable of detecting structural features 17, for example the edges of an empty pouch. It is connected to an image evaluation unit which uses this data to calculate the central position of the pouch. The position of the pouch 3 with respect to the feed hole will change little over a fairly long section of the tape. This means that the measured values can be used for correcting the pick-up over a fairly long sequence of pouches. In case the number of pick-up faults should increase, then the measuring operation can be performed again in order to be able to determine the changed pick-up position.

On its flat side the drive wheel is provided with a rotating angular scale 13 in the form of a magnetized film. Directed at the latter is a sensor head 14 in a stationary arrangement which is capable of detecting the angular position of the drive wheel and conveying it to a control facility 15. In the following drive step, this facility controls a drive motor 16 in such a manner that the advance distance is modified by the ascertained correction amount. A consistent separation spacing can then be maintained in the following feed steps.

Exemplary embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

List of reference characters 1 Tape 2 Feed hole 3 Pouch 4 Components 5 Feed mechanism 6 Component mounting head 7 Drive wheel 8 Transport pin 9 Suction gripping device 10 Scanning optical system 11 Lighting facility 12 Pick-up point 13 Angle scale 14 Sensor head 15 Control facility 16 Motor 17 Structural feature 18 Carrier

The invention claimed is:

1. A device for feeding taped electrical components in a feeding mechanism, comprising:
   a drive, including a motor, a drive wheel adapted to be driven by the motor, and a control facility for modifying an advance distance, the drive being adapted to advance a tape, including feed holes adapted to receive transport pins of the drive wheel, the tape being adapted to accommodate the components, the components being taken up in pouches on the tape and being transportable to a defined pick-up position, wherein the control facility is adapted to correct the defined pick-up position of the components by modifying the advance distance based on a deviation between the defined pick-up position and an actual pick-up position, and wherein the actual pick-up position is determined based on measured structural features of the tape.

2. The device according to claim 1, wherein the drive wheel includes an angle scale, and wherein the feed mechanism includes a sensor head for sensing the angle scale and detecting the angular position of the drive wheel.

3. The device according to claim 1, wherein a plurality of feed mechanisms are arranged side by side on a carrier perpendicular to the advance direction and wherein the pick-up points for the individual feed mechanisms are alignable in a straight line.

4. A method for feeding taped electrical components using the feeding mechanism according to claim 1, in a device for mounting components on substrates, comprising:
   advancing the tape accommodating the electrical components, stepwise, by the drive for the feed mechanism;
   optically sensing structural features associated with the pick-up points for the components;
   directing a measuring device directly onto the pouches on the tape;

determining the precise pick-up position of the components; and correcting the pick-up position of the components by changing the stopping position of the drive.

5. The method of claim 4, wherein the step of optically sensing includes sensing structural features associated with the pick-up points for the components using the measuring device on the component mounting device.

6. A method for feeding taped electrical components using the feeding mechanism according to claim 2, in a device for mounting components on substrates, comprising:

advancing the tape accommodating the electrical components, stepwise, by the drive for the feed mechanism;

optically sensing structural features associated with the pick-up points for the components;

directing a measuring device directly onto the pouches on the tape;

determining the precise pick-up position of the components; and correcting the pick-up position of the components by changing the stopping position of the drive.

7. The method of claim 6, wherein the step of optically sensing includes sensing structural features associated with the pick-up points for the components using the measuring device on the component mounting device.

8. A method for feeding taped electrical components using the feeding mechanism according to claim 3, in a device for mounting components on substrates, comprising:

advancing the tape accommodating the electrical components, stepwise, by the drive for the feed mechanism;

optically sensing structural features associated with the pick-up points for the components;

directing a measuring device directly onto the pouches on the tape;

determining the precise pick-up position of the components; and correcting the pick-up position of the components by changing the stopping position of the drive.

9. The method of claim 8, wherein the step of optically sensing includes sensing structural features associated with the pick-up points for the components using the measuring device on the component mounting device.

10. A method for feeding taped electrical components using a feeding mechanism, in a device for mounting components on substrates, comprising:

advancing a tape accommodating the electrical components, stepwise, by a drive for the feed mechanism;

optically measuring structural features of the tape associated with pick-up points for the components;

determining a precise pick-up position of the components based on the measured structural features of the tape; and correcting the pick-up position of the components to the determined precise pick-up position by changing a stopping position of the drive based on a deviation between the pick-up position and the determined precise pick-up position.

11. The method of claim 10, wherein a precise pick-up position of the components is determined by directing a measuring device directly onto pouches on the tape.

12. The method of claim 10, wherein the step of optically sensing includes sensing structural features associated with the pick-up points for the components using a measuring device on the component mounting device.

13. The method of claim 12, wherein a precise pick-up position of the components is determined by directing the measuring device directly onto pouches on the tape.

14. The method of claim 10, wherein the drive further includes a control facility for modifying an advance distance, the control facility modifying the advance distance in order to achieve small correction steps.

15. The device according to claim 2, wherein a plurality of feed mechanisms are arranged side by side on a carrier perpendicular to the advance direction and wherein the pick-up points for the individual feed mechanisms are alignable in a straight line.

16. A device for mounting electrical components, the device comprising:

a feed mechanism including a drive, which further includes a motor, and a drive wheel adapted to be driven by the motor, wherein the drive is adapted to advance a tape, which includes feed holes adapted to receive transport pins of the drive wheel, and which is adapted to accommodate the components, wherein the components are taken up in pouches on the tape and are transportable to a defined pick-up position, a mounting head including a scanning optical system adapted to detect structural features of the tape associated with the pick-up points of the components;

an image evaluation unit linked to the scanning optical system, the image evaluation unit capable of determining an actual pick-up position of the components based on measured values; and a control facility for modifying an advance distance of the drive, wherein the control facility is adapted to correct the defined pick-up position of the components by modifying the advance distance based on a deviation between the defined pick-up position and an actual pick-up position.

* * * * *